(12) United States Patent
Jang et al.

(10) Patent No.: US 11,322,476 B2
(45) Date of Patent: May 3, 2022

(54) MANUFACTURING METHOD OF PRODUCING SHIELDED INDIVIDUAL SEMICONDUCTOR PACKAGES

(71) Applicant: DISCO CORPORATION, Tokyo (JP)

(72) Inventors: Byeongdeck Jang, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 281 days.

(21) Appl. No.: 16/580,072

(22) Filed: Sep. 24, 2019

(65) Prior Publication Data
US 2020/0105715 A1    Apr. 2, 2020

(30) Foreign Application Priority Data
Sep. 28, 2018 (JP) .............................. JP2018-185537

(51) Int. Cl.
*H01L 23/552*    (2006.01)
*H01L 23/00*    (2006.01)
*H01L 23/544*    (2006.01)

(52) U.S. Cl.
CPC ............ *H01L 24/97* (2013.01); *H01L 23/544* (2013.01); *H01L 23/552* (2013.01); *H01L 24/17* (2013.01); *H01L 2223/54426* (2013.01)

(58) Field of Classification Search
CPC ..... H01L 24/97; H01L 23/544; H01L 23/552; H01L 24/17; H01L 2223/54426
USPC ........................................................ 438/106
See application file for complete search history.

(56) References Cited

U.S. PATENT DOCUMENTS

| | | | | |
|---|---|---|---|---|
| 2003/0209673 A1* | 11/2003 | Ono | ......................... | H01J 9/14 |
| | | | | 250/396 R |
| 2011/0101512 A1* | 5/2011 | Choi | ....................... | H01L 24/82 |
| | | | | 257/686 |
| 2017/0221859 A1* | 8/2017 | Chen | ..................... | H01L 23/552 |
| 2017/0373048 A1* | 12/2017 | Yu | .............................. | H01L 25/50 |
| 2018/0151540 A1* | 5/2018 | Yu | ..................... | H01L 23/49822 |
| 2018/0182715 A1* | 6/2018 | Kim | .................... | H01L 21/4853 |
| 2018/0269181 A1* | 9/2018 | Yang | ...................... | H01L 25/50 |

FOREIGN PATENT DOCUMENTS

| | | | | | |
|---|---|---|---|---|---|
| JP | 2017084105 A | * | 5/2017 | | |
| JP | 2017084105 A | | 5/2017 | | |
| KR | 20180118521 A | * | 10/2018 | ......... | H01L 23/3135 |

* cited by examiner

*Primary Examiner* — Didarul A Mazumder
(74) *Attorney, Agent, or Firm* — Greer Burns & Crain Ltd.

(57) ABSTRACT

A manufacturing method of a semiconductor package includes a groove forming step of cutting a semiconductor package substrate from an upper surface side along division lines in a cut-in-depth range of at least such a depth as to cause a ground line included in a wiring substrate to be exposed in a processing groove to such a depth that the semiconductor package substrate is not fully cut with a first cutting blade, thereby forming the processing groove having a first width at least on an upper surface of a sealing material, a shielding layer forming step of forming a shielding layer on a side surface of the processing groove, a bottom surface of the processing groove, and the upper surface of the sealing material with a conductive material from an upper side of the sealing material, and a dividing step of, cutting the semiconductor package substrate into individual semiconductor packages.

6 Claims, 8 Drawing Sheets

MANUFACTURING METHOD OF PRODUCING SHIELDED INDIVIDUAL SEMICONDUCTOR PACKAGES

BACKGROUND OF THE INVENTION

Field of the Invention

The present invention relates to a manufacturing method of a semiconductor package.

Description of the Related Art

A semiconductor package substrate is, in general, formed by mounting a semiconductor chip on a wiring substrate and sealing the semiconductor chip with a sealing material such as a resin (for example, see Japanese Patent Application No. 2017-084105). However, in recent years, a semiconductor package substrate has been developed in which, in order to effectively use a space beside a solder ball bonding to a side opposite to the semiconductor chip on the wiring substrate, another semiconductor chip is additionally provided between the adjacent solder balls, and both sides of the wiring substrate are sealed with the sealing material.

The semiconductor package substrate having a semiconductor chip on either side of the wiring substrate is normally covered with a conductive shielding layer after being divided into individual semiconductor packages. The conductive shielding layer is formed on an outer surface of the semiconductor package by sputtering. As described above, the conventional manufacturing method of a semiconductor package which forms the shielding layer has the following problems.

SUMMARY OF THE INVENTION

In a case in which the shielding layer is formed on the individual semiconductor packages which have been singulated, since a thickness of each of the semiconductor packages is large, it has been difficult to form the shielding layer having a sufficient thickness on a bottom side of each semiconductor package, and an adhesion strength of the shielding layer on the bottom side has tended to be weak. In addition, upon sputtering, components of the shielding layer are also adhered to a sputtering tape which supports the semiconductor package. As a result, when the semiconductor package is picked up from the sputtering tape after sputtering, the shielding layer may be partially peeled off from the semiconductor package, and a burr may occur in the shielding layer, for example, thereby causing deterioration in quality.

However, if the semiconductor chip on a lower side of the wiring substrate does not generate an electromagnetic wave affecting another semiconductor chip or generates an electromagnetic wave having a frequency which is blocked by a wiring formed of a metal in the wiring substrate or a solder ball for mounting, as long as the shielding layer which covers an upper surface of the wiring substrate and connects to a ground line of the wiring substrate is only formed, it is not always required to form the shielding layer on the entire bottom side of each semiconductor package.

In addition, as described above, in the manufacturing method of a semiconductor package in which a shielding layer is formed by sputtering, it has been required to transfer the singulated semiconductor packages supported on a dicing tape in a singulating step onto a sputtering tape before sputtering. This transferring process requires a step of transferring the singulated semiconductor packages one by one from the dicing tape to the sputtering tape, resulting in an increase in number of required process steps. Accordingly, the manufacturing method of a semiconductor package in which a shielding layer is formed by sputtering as described above has a problem that the number of required process steps related to manufacture increases. In addition, there is a disadvantage that formation of a shielding layer by plating cannot be applied to the singulated semiconductor packages.

It is therefore an object of the present invention to provide a manufacturing method of a semiconductor package capable of preventing an increase in number of required process steps.

In accordance with an aspect of the present invention, there is provided a manufacturing method of a semiconductor package by dividing a semiconductor package substrate along a plurality of intersecting division lines, into individual semiconductor packages, the semiconductor package substrate in which a plurality of semiconductor chips are mounted on an upper surface of a wiring substrate demarcated by the plurality of intersecting division lines, a plurality of solder balls are mounted on a lower surface of the wiring substrate, and both the upper surface and the lower surface are sealed by a sealing material, thereby manufacturing individual semiconductor packages. The manufacturing method includes a groove forming step of cutting the semiconductor package substrate from the upper surface side along the division lines in a cut-in-depth range of at least such a depth as to cause a ground line included in the wiring substrate to be exposed in a processing groove to such a depth that the semiconductor package substrate is not fully cut with first cutting means, thereby forming the processing groove having a first width at least on an upper surface of the sealing material, a shielding layer forming step of, after the groove forming step is carried out, forming a shielding layer on a side surface of the processing groove, a bottom surface of the processing groove, and the upper surface of the sealing material with a conductive material from an upper side of the sealing material, and a dividing step of, after the shielding layer forming step is carried out, cutting the semiconductor package substrate at such a width that the shielding layer formed over the side surface of the processing groove is not removed with second cutting means, thereby dividing the semiconductor package substrate into individual semiconductor packages.

Preferably, in the groove forming step, an upper surface of the processing groove has a first width larger than a second width of the bottom surface of the processing groove, and the side surface of the processing groove is inclined.

The present invention provides an effect that an increase in required process steps can be prevented.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described in detail below with reference to the drawings.

Note that the present invention is not limited to description in the following embodiments. In addition, constituent elements in the following embodiments include those that can be easily conceived by persons skilled in the art or that are substantially equivalent. Further, the configurations described below can be used in combination as needed. In addition, the configurations may be variously omitted, replaced, or changed without departing from the gist of the present invention.

First Embodiment

Figure 1:
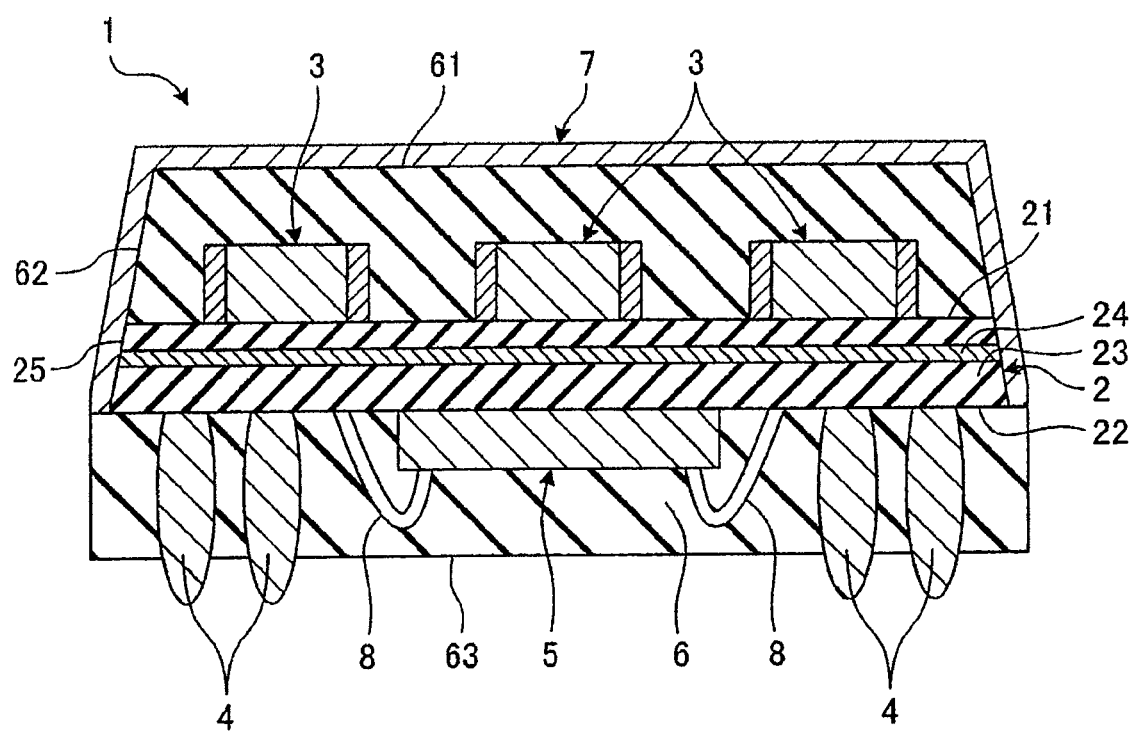
FIG. 1 is a cross-sectional view schematically illustrating a semiconductor package manufactured by a manufacturing method of a semiconductor package according to a first embodiment of the present invention.
Figure 2:
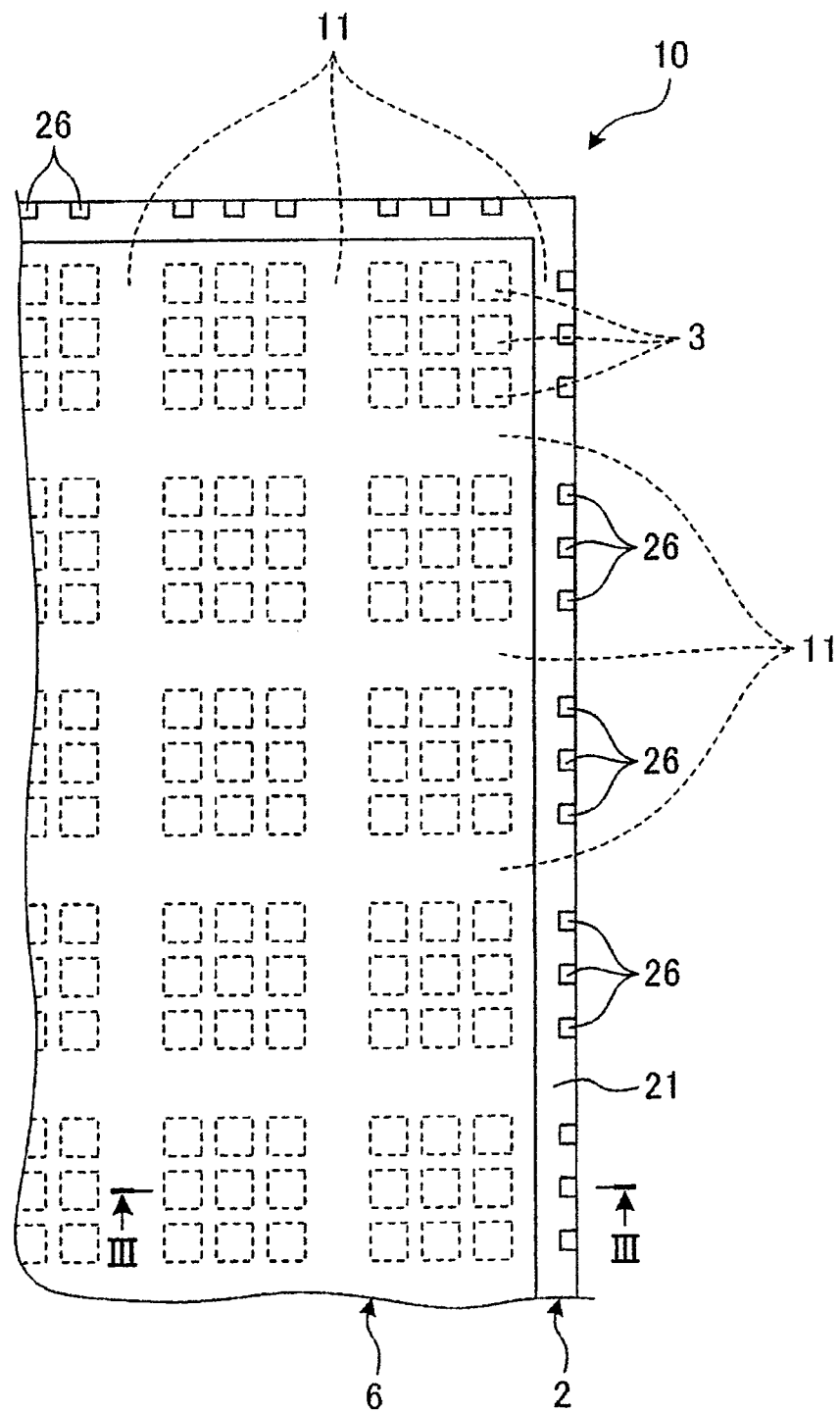
FIG. 2 is a plan view illustrating a semiconductor package substrate to be divided into individual semiconductor packages through the manufacturing method of the semiconductor package according to the first embodiment.
Figure 3:
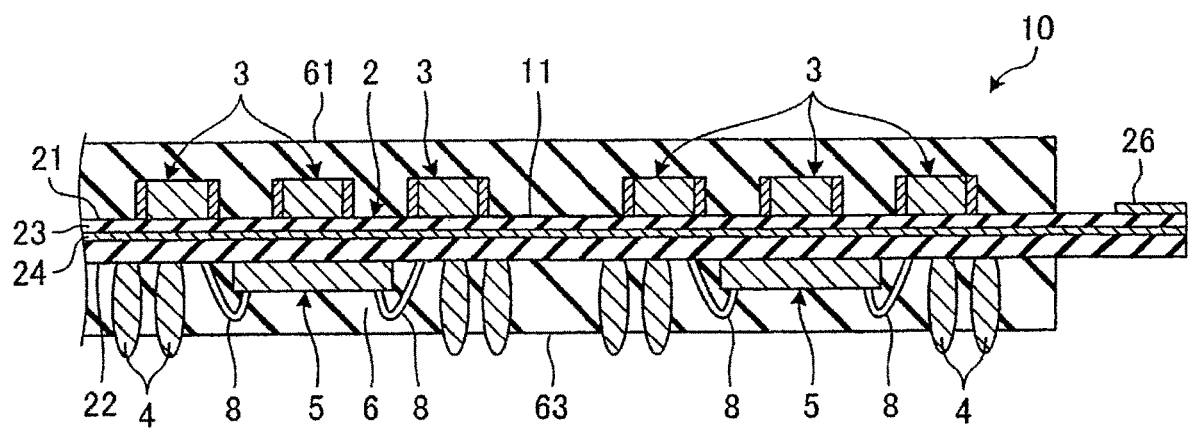
FIG. 3 is a cross-sectional view taken along a line III-III of FIG. 2.
Figure 4:
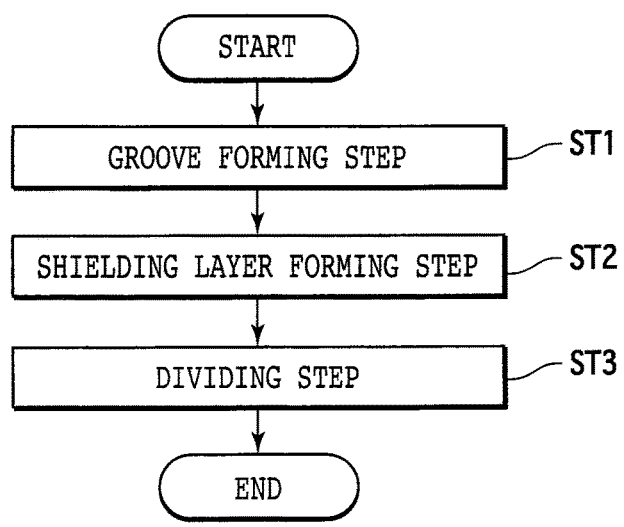
FIG. 4 is a flow chart illustrating a flow of the manufacturing method of the semiconductor package according to the first embodiment.

A manufacturing method of a semiconductor package according to a first embodiment of the present invention will be described in accordance with the drawings. FIG. 1 is a cross-sectional view schematically illustrating a semiconductor package manufactured by a manufacturing method of a semiconductor package according to the first embodiment of the present invention. FIG. 2 is a plan view illustrating a semiconductor package substrate to be divided into individual semiconductor packages through the manufacturing method of the semiconductor package according to the first embodiment. FIG. 3 is a cross-sectional view taken along a line III-III of FIG. 2. FIG. 4 is a flow chart illustrating a flow of the manufacturing method of the semiconductor package according to the first embodiment.

The manufacturing method of a semiconductor package according to the first embodiment is a method of manufacturing a semiconductor package illustrated in FIG. 1. A semiconductor package 1 manufactured by the manufacturing method of a semiconductor package according to the first embodiment is a semiconductor device including all types of packaged semiconductor device that requires shielding by a so-called electro-magnetic interference (EMI) and is configured such that leakage of an electromagnetic noise to surroundings thereof is suppressed by a shielding layer 7 provided at an outer surface thereof.

As illustrated in FIG. 1, the semiconductor package 1 includes a wiring substrate 2 (also referred to as an interposer), a plurality of semiconductor chips 3 mouthed on an upper surface 21 of the wiring substrate 2, a plurality of solder balls 4 mounted on a lower surface 22 of the wiring substrate 2, a lower-side semiconductor chip 5 mounted on the lower surface 22, a sealing material 6 sealing the upper surface 21 and the lower surface 22 of the wiring substrate 2, and the shielding layer 7.

The wiring substrate 2 includes an insulating plate 23 having an insulating property, and a ground line 24 provided inside the insulating plate 23. The ground line 24 is embedded inside the insulating plate 23 of the wiring substrate 2 and composed of a conductive metal. In addition, the upper surface 21 and the lower surface 22 of the wiring substrate 2 have electrodes and various kinds of wirings connected to the semiconductor chips 3 and 5 formed thereon.

The semiconductor chip 3 and the lower-side semiconductor chip 5 each include integrated circuits (ICs), large scale integrations (LSIs), and the like. In the first embodiment, nine semiconductor chips 3 as a group are mounted on the upper surface 21 of the wiring substrate 2 at an equal interval, and one lower-side semiconductor chip 5 is mounted on the lower surface 22 of the wiring substrate 2 at a position as to correspond to a center of the arranged nine semiconductor chips 3 for each semiconductor package to be formed. In addition, in the first embodiment, the semiconductor chip 3 is mounted on the upper surface 21 of the wiring substrate 2 by flip-chip bonding by which electrodes (not illustrated) provided on a lower surface of the semiconductor chip 3 are directly connected to the upper surface 21 of the wiring substrate 2. In addition, in the first embodiment, one end of a wire 8 is connected to an upper surface of the lower-side semiconductor chip 5, and the other end of the wire 8 is connected to the lower surface 22 of the wiring substrate 2. In other word, the lower-side semiconductor chip 5 is mounted on the lower surface 22 of the wiring substrate 2 by a so-called wire bonding. The solder ball 4 is composed of a conductive metal, and a plurality of the solder balls 4 are provided in a periphery of the lower-side semiconductor chip 5 on the lower surface 22 of the wiring substrate 2. The solder ball 4 suppresses leakage of an electromagnetic noise from the lower-side semiconductor chip 5 to the surroundings thereof.

The sealing material 6 is composed of a synthetic resin having an insulating property and seals (covers) the semiconductor chips 3, the lower-side semiconductor chips 5, the wires 8, and a proximal end portion of each of the solder balls 4 which is closer to the wiring substrate 2. The sealing material 6 is formed from epoxy resins, silicone resins, urethane resins, unsaturated polyester resins, acrylic urethane resins, polyimide resins, or the like. Also, a distal end portion of each of the solder balls 4 which is spaced apart from the wiring substrate 2 is exposed outside the sealing material 6.

The shielding layer 7 includes at least one conductive metal selected from copper, titanium, nickel, gold, or the like, and is a multilayer film having a thickness of several micrometers. The shielding layer 7 is formed on an upper surface 61 of the sealing material 6 parallel to the upper surface 21 of the wiring substrate 2, on an outer side surface 62 of the sealing material 6 which is continuous to the upper surface 61 on a side closer to the upper surface 61 than the wiring substrate 2, and on an outer side surface 25 of the wiring substrate 2. The shielding layer 7 is connected to the ground line 24. The outer side surface 62 is gradually inclined in a direction extending outside the semiconductor package 1 as the outer side surface 62 extends toward a lower surface 63 of the sealing material 6 from the upper surface 61. The shielding layer 7 is not formed on a side closer to the lower surface 63 of the sealing material 6 than the wiring substrate 2. In addition, in the first embodiment, the shielding layer 7 is formed on the outer side surface 25 of the wiring substrate 2. However, in the present invention, as long as the shielding layer 7 is connected to the ground line 24, the shielding layer 7 may not be provided on the side closer to the lower surface 63 than the ground line 24 of the wiring substrate 2. The shielding layer 7 prevents leakage of an electromagnetic noise from the semiconductor chip 3 to the surroundings thereof.

The semiconductor package 1 having a configuration described above is manufactured in such a way that a semiconductor package substrate 10 illustrated in FIGS. 2 and 3 is divided along a plurality of division lines 11 and the shielding layer 7 is formed. As illustrated in FIGS. 2 and 3, the semiconductor package substrate 10 is a package substrate in which the plurality of semiconductor chips 3 are mounted on the upper surface 21 of the wiring substrate 2 demarcated along the plurality of division lines 11 into a plurality of separate regions and the plurality of solder balls 4 are mounted on the lower surface 22 of the wiring substrate 2 and both the upper surface 21 and the lower surface 22 are then sealed by the sealing material 6. In the first embodiment, the semiconductor package substrate 10 has nine of the semiconductor chips 3 mounted in each of the separate regions demarcated by the plurality of division lines 11 on the upper surface 21 of the wiring substrate 2. Moreover, the semiconductor package substrate 10 has one lower-side semiconductor chip 5 mounted on the lower surface 22 of the wiring substrate 2 in each of the regions demarcated by the plurality of division lines 11.

Note that the semiconductor package substrate 10 illustrated in FIGS. 2 and 3 has not been formed with the shielding layer 7 yet. Also, in the first embodiment, as illustrated in FIGS. 2 and 3, in the semiconductor package substrate 10, the sealing material 6 seals the semiconductor chip 3 and the like in a state in which an outer edge portion of the wiring substrate 2 is exposed, and a plurality of alignment marks 26 are formed on the upper surface 21 of the outer edge portion of the wiring substrate 2, the alignment marks 26 for performing alignment in a groove forming step ST1 and a dividing step ST3 to be described later. Although the alignment marks 26 are formed on the upper surface 21 of the outer edge portion of the wiring substrate 2 in the first embodiment, in the present invention, the alignment marks 26 may be formed on the lower surface 22 of the outer edge portion of the wiring substrate 2 and on both the upper surface 21 and the lower surface 22 of the outer edge portion of the wiring substrate 2.

The manufacturing method of a semiconductor package according to the first embodiment is a method by which the semiconductor package substrate 10 illustrated in FIGS. 2 and 3 is divided into individual pieces along the plurality of division lines 11 and the shielding layer 7 is formed, thereby manufacturing individual semiconductor packages 1. The manufacturing method of a semiconductor package includes the groove forming step ST1, a shielding layer forming step ST2, and the dividing step ST3 as illustrated in FIG. 4.

(Groove Forming Step)

Figure 5:
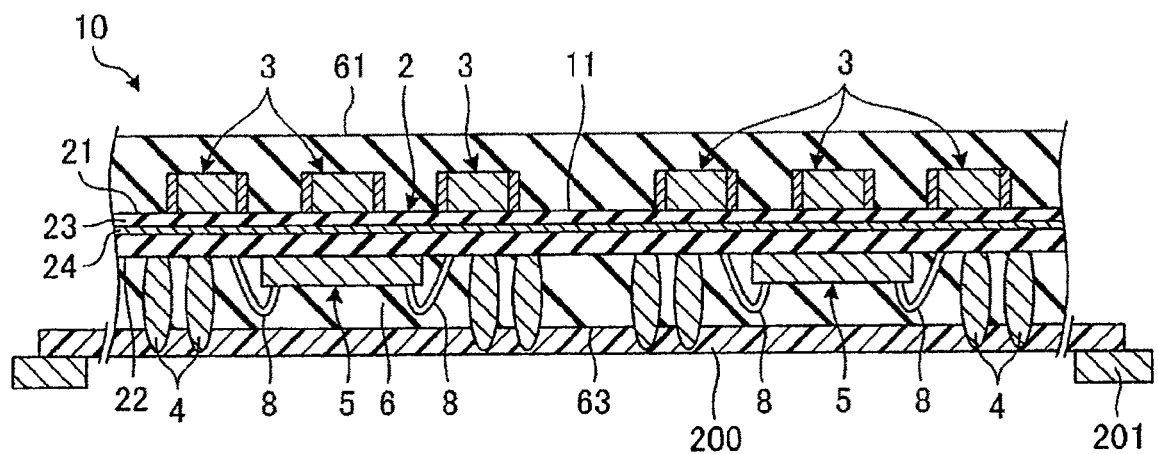
FIG. 5 is a cross-sectional view schematically illustrating a state in which the semiconductor package substrate is supported by a dicing tape in a groove forming step in the manufacturing method of the semiconductor package illustrated in FIG. 4.
Figure 6:
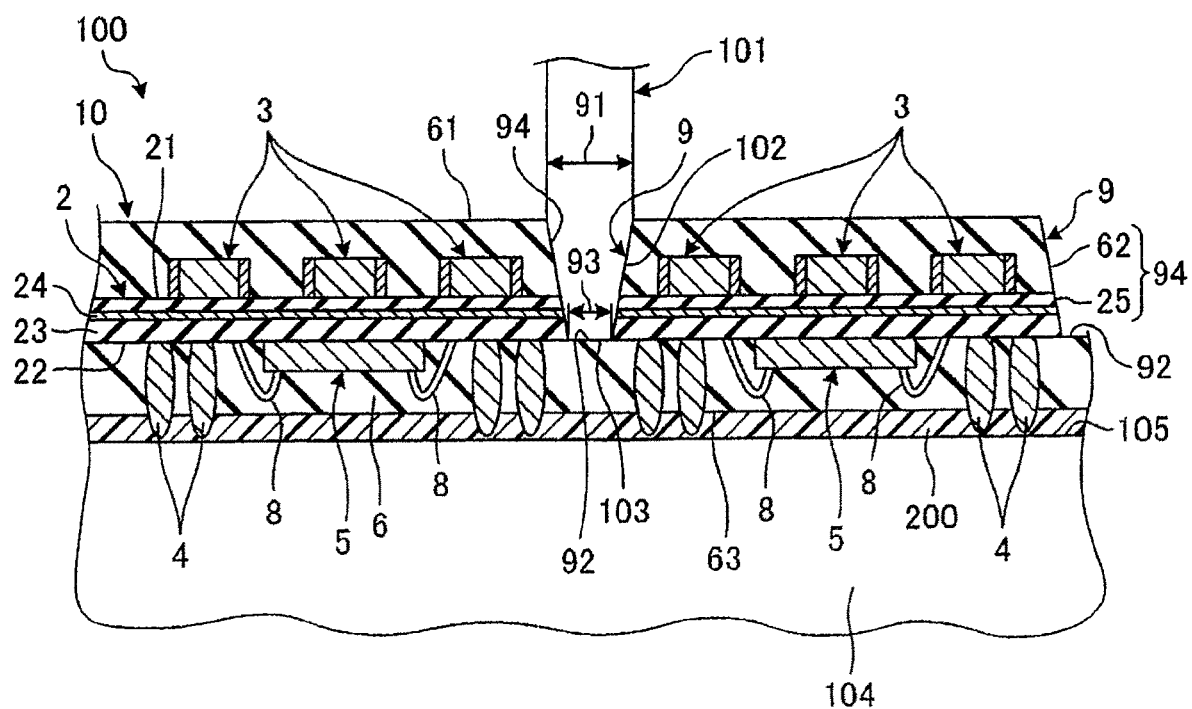
FIG. 6 is a cross-sectional view schematically illustrating the groove forming step in the manufacturing method of the semiconductor package illustrated in FIG. 4.
Figure 7:
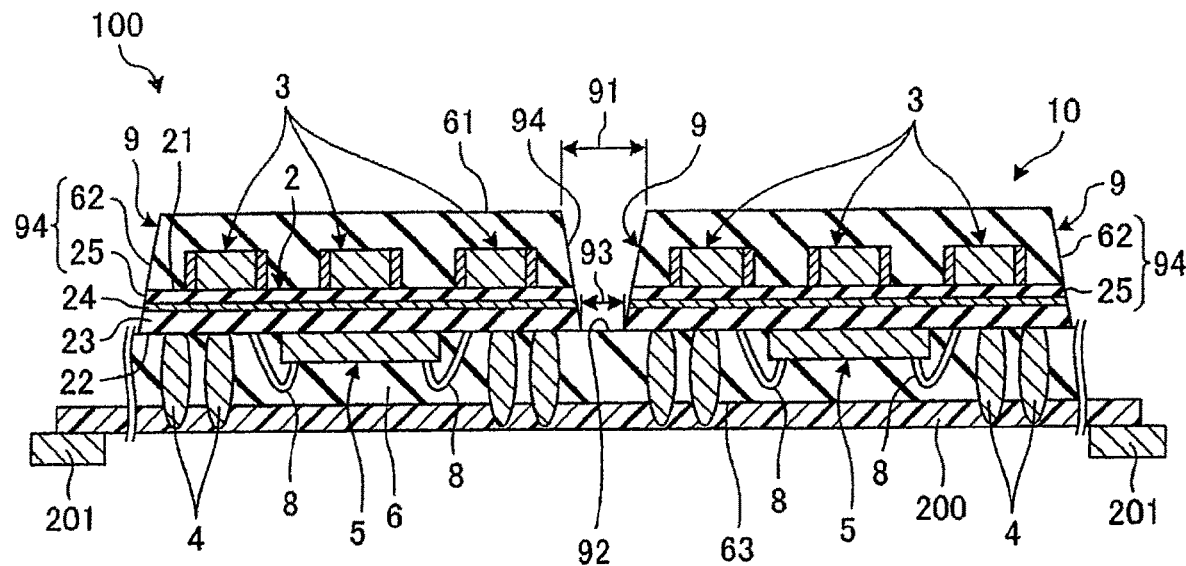
FIG. 7 is a cross-sectional view schematically illustrating the semiconductor package substrate after the groove forming step in the manufacturing method of the semiconductor package illustrated in FIG. 4 is carried out.

FIG. 5 is a cross-sectional view schematically illustrating a state in which the semiconductor package substrate is supported by a dicing tape in the groove forming step in the manufacturing method of the semiconductor package illustrated in FIG. 4. FIG. 6 is a cross-sectional view schematically illustrating the groove forming step in the manufacturing method of the semiconductor package illustrated in FIG. 4. FIG. 7 is a cross-sectional view schematically illustrating the semiconductor package substrate after the groove forming step in the manufacturing method of the semiconductor package illustrated in FIG. 4 is carried out.

In the groove forming step ST1, the semiconductor package substrate 10 is cut from the upper surface 21 side along the division lines 11 in a cut-in-depth range of at least such a depth as to cause the ground line 24 included in the wiring substrate 2 (illustrated in FIG. 5) to be exposed in a processing groove 9 (illustrated in FIG. 6) to such a depth that the semiconductor package substrate 10 is not fully cut with a first cutting blade 101 serving as first cutting means, so that the processing groove 9 having a first width 91 at least on the upper surface 61 of the sealing material 6 is formed.

The first cutting blade 101 to be used in the groove forming step ST1 is formed into a trapezoidal shape in cross-section in which a center in a thickness direction of a cutting edge 102 protrudes to an outer peripheral side and becomes smaller as the cutting edge 102 extends to the outer peripheral side. The cutting edge 102 of the first cutting blade 101 has a tip end 103 formed to be flat along an axis of the first cutting blade 101, and the cutting edge 102 is tilted in a direction in which the first cutting blade 101 gradually increases its thickness as the cutting edge 102 extends from the tip end 103 to the axis.

In the first embodiment, in the groove forming step ST1, as illustrated in FIG. 5, a dicing tape 200 larger than a planar shape of the semiconductor package substrate 10 is attached to the lower surface 63 of the sealing material 6, and an annular frame 201 is attached to an outer peripheral edge of the dicing tape 200. In the groove forming step ST1, a cutting apparatus 100 sucks and holds the lower surface 63 side of the sealing material 6 of the semiconductor package substrate 10 through the dicing tape 200 on a holding surface 105 of a chuck table 104 of the cutting apparatus 100, as illustrated in FIG. 6. In the groove forming step ST1, an infrared camera (not illustrated) of the cutting apparatus 100 images the upper surface 61 of the sealing material 6 of the semiconductor package substrate 10 to perform alignment for positioning between the semiconductor package substrate 10 and the first cutting blade 101. Note that, in the first embodiment, alignment is performed in accordance with the alignment marks 26 as a reference since the alignment marks 26 formed on the outer edge portion of the upper surface 21 of the wiring substrate 2 are exposed without being sealed with the sealing material 6.

In the groove forming step ST1, the cutting apparatus 100, as illustrated in FIG. 6, cuts the semiconductor package substrate 10 with the first cutting blade 101 from the upper surface 61 side until the first cutting blade 101 reaches the ground line 24 of the wiring substrate 2, while causing the semiconductor package substrate 10 and the first cutting blade 101 to relatively move along the division lines 11, so that the processing groove 9 having a substantially V-shape in cross section is formed on the upper surface 61 of the sealing material 6 of the semiconductor package substrate 10. In the groove forming step ST1 of the first embodiment, the cutting apparatus 100 causes the first cutting blade 101 to cut the semiconductor package substrate 10 to a depth at which the wiring substrate 2 is divided from the upper surface 61 of the sealing material 6 and a depth at which the first cutting blade 101 does not cut the lower surface 63 side of the sealing material 6 which is lower than the wiring substrate 2, thereby forming the processing groove 9.

In the first embodiment, in the groove forming step ST1, the cutting apparatus 100 causes the first cutting blade 101 to cut the semiconductor package substrate 10 to a depth at which the wiring substrate 2 is divided. However, in the present invention, it is sufficient as long as the cutting apparatus 100 causes the first cutting blade 101 to cut the semiconductor package substrate 10 to a depth at which the ground line 24 of the wiring substrate 2 is exposed in the processing groove 9. The cutting apparatus 100 may cause the first cutting blade 101 to cut the semiconductor package substrate 10 to the lower surface 63 side of the sealing material 6 lower than the wiring substrate 2 as long as the semiconductor package substrate 10 is not fully divided. In the present invention, a cut-in depth of the first cutting blade 101 at which the semiconductor package substrate 10 is not fully divided is a depth at which the tip end 103 of the first cutting blade 101 is not exposed from the lower surface 63 and is positioned inside the sealing material 6. Note that, when the processing groove 9 is formed in the sealing material 6 corresponding to the division line 11 of the semiconductor package substrate 10, a side surface 94 of the processing groove 9 includes the outer side surface 62 and the outer side surface 25 which have been described above.

Note that, in the groove forming step ST1, the semiconductor package substrate 10 has the processing grooves 9 along all the division lines 11. The processing groove 9 is, as illustrated in FIG. 7, formed along an external shape of the cutting edge 102 of the first cutting blade 101, and the first width 91 of the upper surface 61 of the sealing material 6 is formed larger than a second width 93 of a bottom surface 92 of the processing groove 9, and the side surface 94 of the processing groove 9 is inclined with respect, to the upper surface 61 and the bottom surface 92. In the manufacturing method of a semiconductor package substrate according to the first embodiment, as illustrated in FIG. 7, the processing grooves 9 are formed on the upper surface 61 side of the sealing material 6 corresponding to all the division lines 11 of the semiconductor package substrate 10, after which the process proceeds to the shielding layer forming step ST2.

(Shielding Layer Forming Step)

Figure 8:
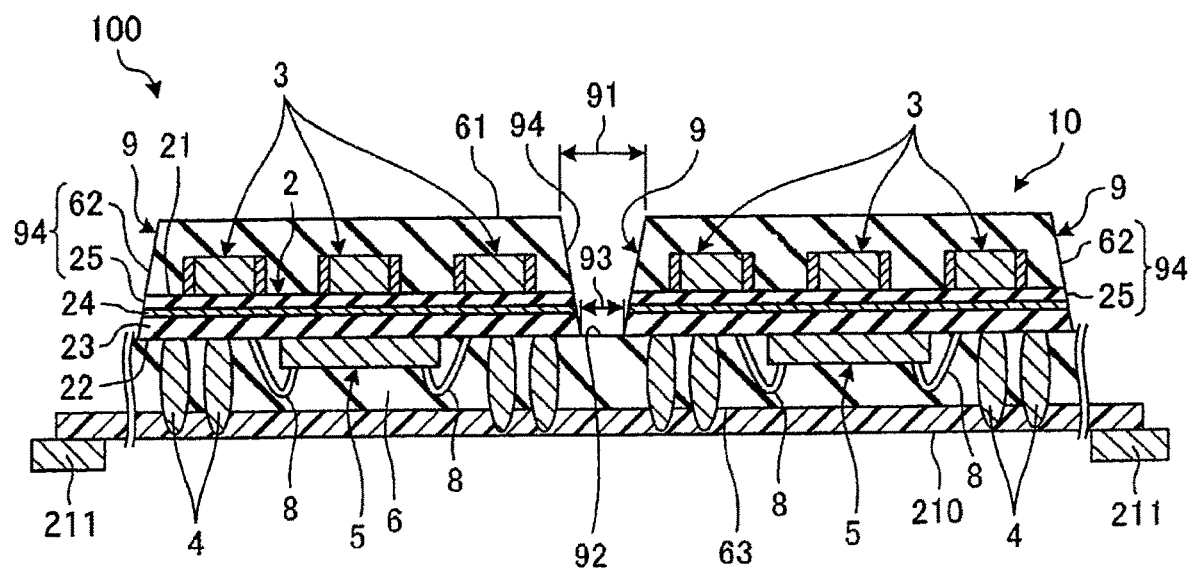
FIG. 8 is a cross-sectional view schematically illustrating a state in which the semiconductor package substrate is supported by a sputtering tape in the groove forming step of the manufacturing method of the semiconductor package illustrated in FIG. 4.
Figure 9:
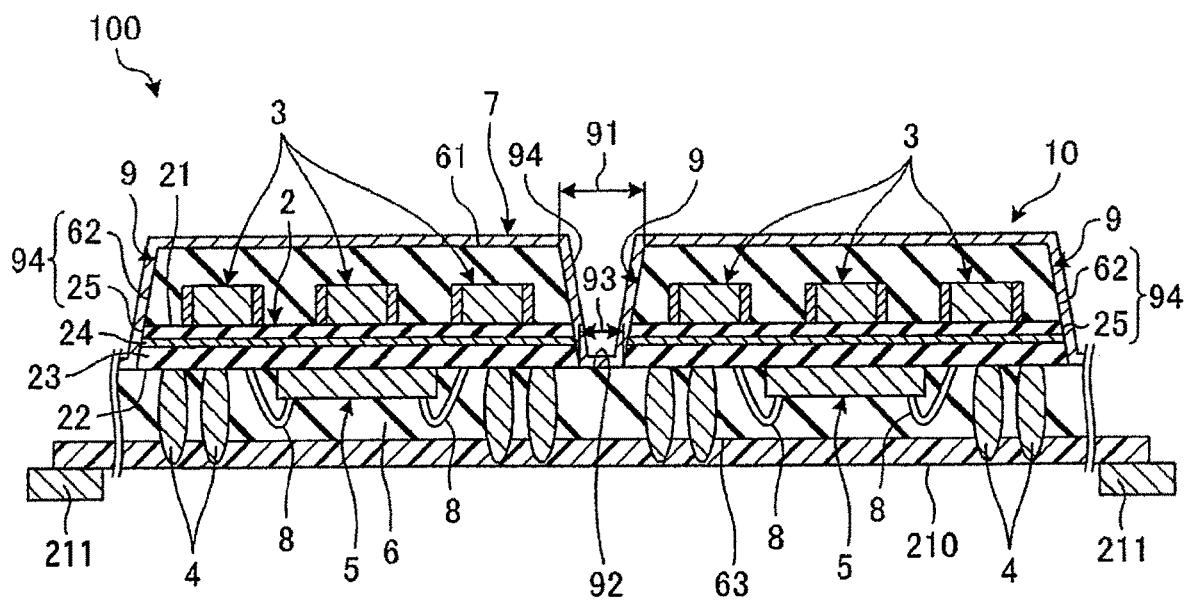
FIG. 9 is a cross-sectional view schematically illustrating the semiconductor package substrate after a shielding layer forming step of the manufacturing method of the semiconductor package illustrated in FIG. 4 is carried out.

FIG. 8 is a cross-sectional view schematically illustrating a state in which the semiconductor package substrate is supported by a sputtering tape in the groove forming step of the manufacturing method of the semiconductor package illustrated in FIG. 4. FIG. 9 is a cross-sectional view schematically illustrating the semiconductor package substrate after the shielding layer forming step of the manufacturing method of the semiconductor package illustrated in FIG. 4 is carried out.

In the shielding layer forming step ST2, the shielding layer 7 is formed over the side surface 94 of the processing groove 9, the bottom surface 92 of the processing groove 9, and the upper surface 61 of the sealing material 6 by adhering a conductive metal from an upper side of the sealing material 6. In the shielding layer forming step ST2, the dicing tape 200 is peeled off from the lower surface 63 of the sealing material 6 of the semiconductor package substrate 10, and as illustrated in FIG. 8, a sputtering tape 210 larger than a planar shape of the semiconductor package substrate 10 is attached to the lower surface 63 of the sealing material 6. Then, an annular frame 211 is attached to an outer peripheral edge of the sputtering tape 210.

In the shielding layer forming step ST2, the semiconductor package substrate 10 is stored in a container, and metals are adhered to the semiconductor package substrate 10 from the upper surface 61 side of the sealing material 6 by sputtering to form the shielding layer 7. In this manner, although the shielding layer 7 is formed by so-called sputtering in the shielding layer forming step ST2 in the first embodiment, the shielding layer 7 may be formed by electroplating in the present invention. As illustrated in FIG. 9, after the shielding layer 7 is formed, the manufacturing method of a semiconductor package proceeds to the dividing step ST3. Note that, as illustrated in FIG. 9, after the shielding layer forming step ST2 is carried out, the semiconductor package substrate 10 has the shielding layer 7 formed over the side surface 94 and the bottom surface 92 of each of the processing grooves 9 formed at respective positions at which to correspond to all the division lines 11, and the upper surface 61 of the sealing material 6.

(Dividing Step)

Figure 10:
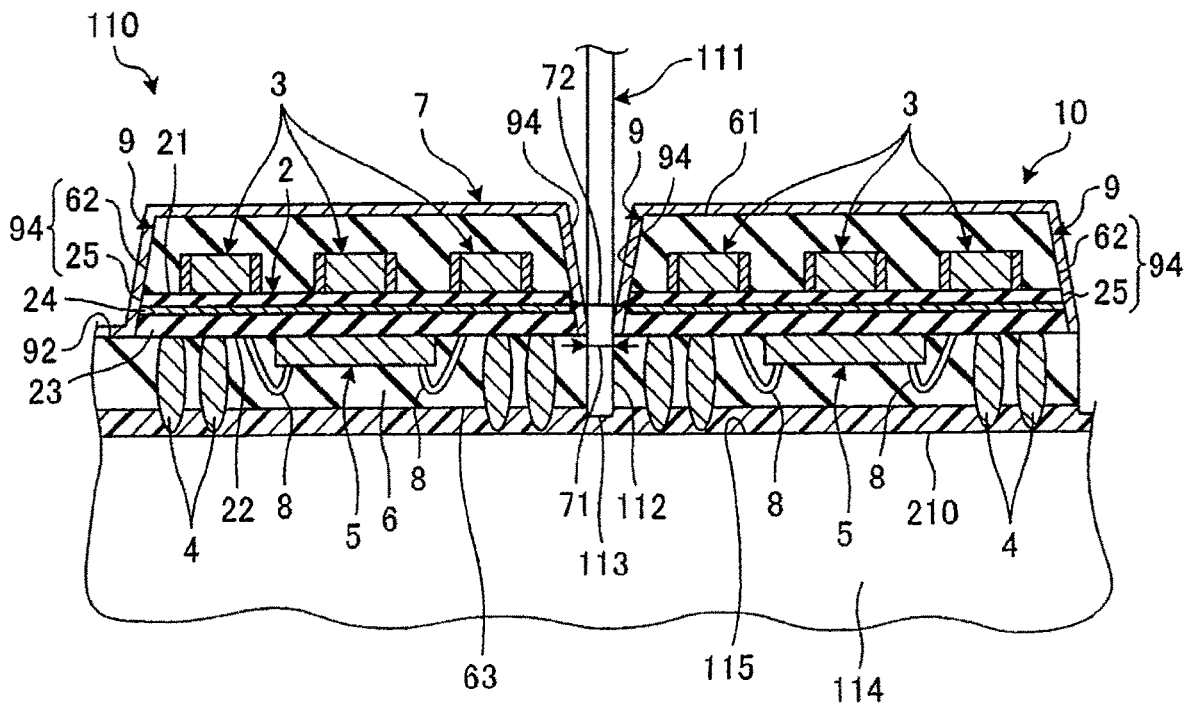
FIG. 10 is a cross-sectional view schematically illustrating a dividing step of the manufacturing method of the semiconductor package illustrated in FIG. 4.
Figure 11:
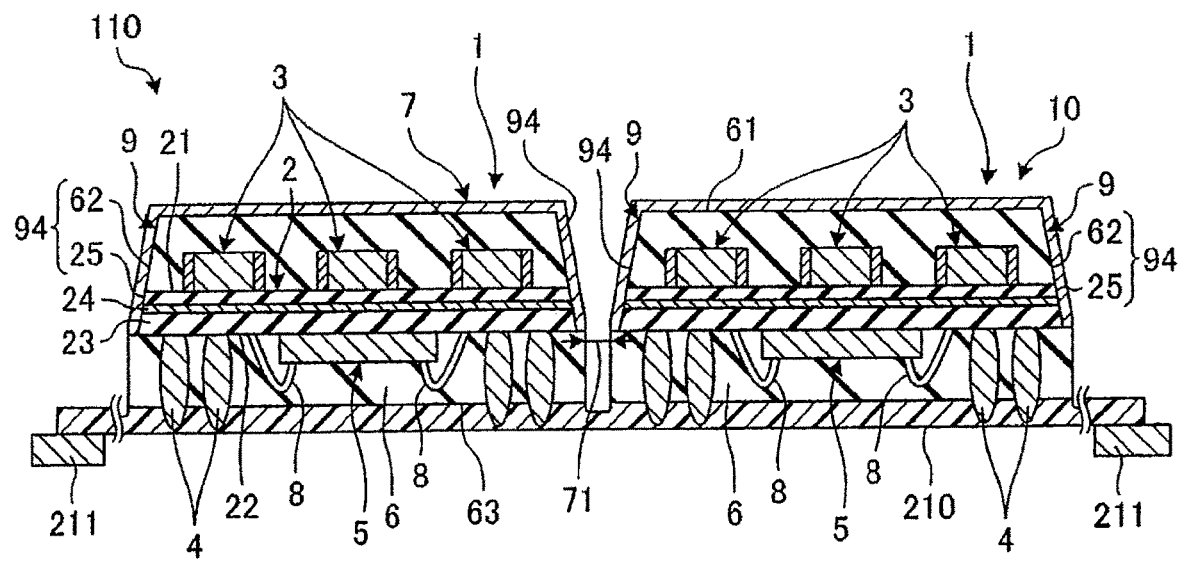
FIG. 11 is a cross-sectional view schematically illustrating the semiconductor package substrate after the dividing step of the manufacturing method of the semiconductor package illustrated in FIG. 4 is carried out.

FIG. 10 is a cross-sectional view schematically illustrating a dividing step of the manufacturing method of the semiconductor package illustrated in FIG. 4. FIG. 11 is a cross-sectional view schematically illustrating the semiconductor package substrate after the dividing step of the manufacturing method of the semiconductor package illustrated in FIG. 4 is carried out.

In the dividing step ST3, after the shielding layer forming step ST2 is carried out, the semiconductor package substrate 10 is cut at a width at which the shielding layer 7 formed over the side surface 94 along the processing groove 9 is not removed with a second cutting blade 111 serving as second cutting means, thereby being divided into individual semiconductor packages 1.

The second cutting blade 111 to be used in the dividing step ST3 has a tip end 113 of a cutting edge 112 thereof formed to be substantially flat along an axis of the second cutting blade 111. In the first embodiment, a thickness of the second cutting blade 111 is formed equal to a space 71 between the shielding layers 7 formed over the side surfaces 94 adjacent to each other at the bottom surface 92 of the processing groove 9. In the present invention, however, the thickness of the second cutting blade 111 is only required to be smaller than a space 72 between the adjacent shielding layers 7 formed over the ground lines 24 on the side surfaces 94 of the processing groove 9. In short, although the width at which the shielding layer 7 is not removed is equal to the space 71 between the adjacent shielding layers 7 over the side surfaces 94 at the bottom surface 92 of the processing groove 9 in the first embodiment, the width at which the shielding layer 7 is not removed may be equal to or smaller than the space 72 between the adjacent shielding layers 7 formed over the ground lines 24 on the side surfaces 94 of the processing groove 9 in the present invention. In other words, in the present invention, the width at which the shielding layer 7 is not removed is in a range exceeding zero and equal to or smaller than the space 72 between the shielding layers 7 formed over the ground lines 24 on the side surfaces 94 of the processing groove 9 and is a width at which a portion of the shielding layer 7 connecting to the ground line 24 remains after the dividing step ST3 is carried out.

In the first embodiment, in the dividing step ST3, as illustrated in FIG. 10, a cutting apparatus 110 sucks and holds the lower surface 63 side of the sealing material 6 of the semiconductor package substrate 10 through the sputtering tape 210 on a holding surface 115 of a chuck table 114 of the cutting apparatus 110. In the dividing step ST3, an imaging unit (not illustrated) of the cutting apparatus 110 images the upper surface 61 of the sealing material 6 of the semiconductor package substrate 10, and alignment for positioning between the semiconductor package substrate 10 and the second cutting blade 111 is performed. Note that, in the first embodiment, alignment is performed in accordance with the alignment marks 26 as a reference, since the alignment marks 26 formed on the outer edge portion of the upper surface 21 of the wiring substrate 2 are exposed without being sealed with the sealing material 6. In addition, in the dividing step ST3, in a case in which the sputtering tape 210 is not suitable for dicing, it may be replaced with a dicing tape.

In the dividing step ST3, the cutting apparatus 110 cuts the bottom surface 92 of the processing groove 9 with the second cutting blade 111 from the upper surface 61 side until the second cutting blade 111 reaches the sputtering tape 210, while causing the semiconductor package substrate 10 and the second cutting blade 111 to relatively move along the division lines 11, thereby dividing the semiconductor package substrate 10 into individual semiconductor packages 1. As illustrated in FIG. 11, the manufacturing method of a semiconductor package according to the first embodiment ends after causing the second cutting blade 111 to cut the bottom surfaces 92 of the processing grooves 9 corresponding to all of the division lines 11 of the semiconductor package substrate 10. Note that the individual semiconductor packages 1 thus divided are picked up from the sputtering tape 210 by a well-known pick-up apparatus or the like.

Since the semiconductor package substrate 10 is cut in with the first cutting blade 101 to the depth not fully being cut in the groove forming step ST1, the manufacturing method of a semiconductor substrate according to the first embodiment can reduce a time required for forming the shielding layer 7 in the shielding layer forming step ST2 and can reduce the number of process steps required for transferring the semiconductor package substrate 10 from the dicing tape 200 to the sputtering tape 210. As a result, the manufacturing method of a semiconductor package according to the first embodiment provides an effect that an increase in number of required process steps can be suppressed.

In addition, since the semiconductor package substrate 10 is cut in with the first cutting blade 101 to the depth not fully being cut in the groove forming step ST1 and the shielding layer 7 is then formed in the shielding layer forming step ST2, the manufacturing method of a semiconductor package according to the first embodiment can prevent the shielding layer 7 from coming in contact with the sputtering tape 210. As a result, the manufacturing method of a semiconductor package according to the first embodiment can prevent peeling-off of the shielding layer 7 and occurrence of a burr in the shielding layer 7.

Moreover, in the manufacturing method of a semiconductor package according to the first embodiment, since the semiconductor package substrate 10 is cut with the first cutting blade 101 to the depth not fully being cut in the groove forming step ST1 and the shielding layer 7 is then formed in the shielding layer forming step ST2, the shielding layer 7 is not formed on the periphery of the lower surface 63. As a result, the manufacturing method of a semiconductor package according to the first embodiment can prevent the thickness of the shielding layer 7 from being smaller especially in the periphery of the lower surface 63 and can prevent the adhesion strength of the shielding layer 7 to the sealing material 6 from being lowered.

Although, in the manufacturing method of a semiconductor package according to the first embodiment, the dividing step ST3 is carried out in a state in which the sputtering tape 210 is attached to the lower surface 63, the dividing step ST3 may be carried out by peeling off the sputtering tape 210 from the lower surface 63 and then, attaching a dicing tape to the lower surface 63.

Second Embodiment

Figure 12:
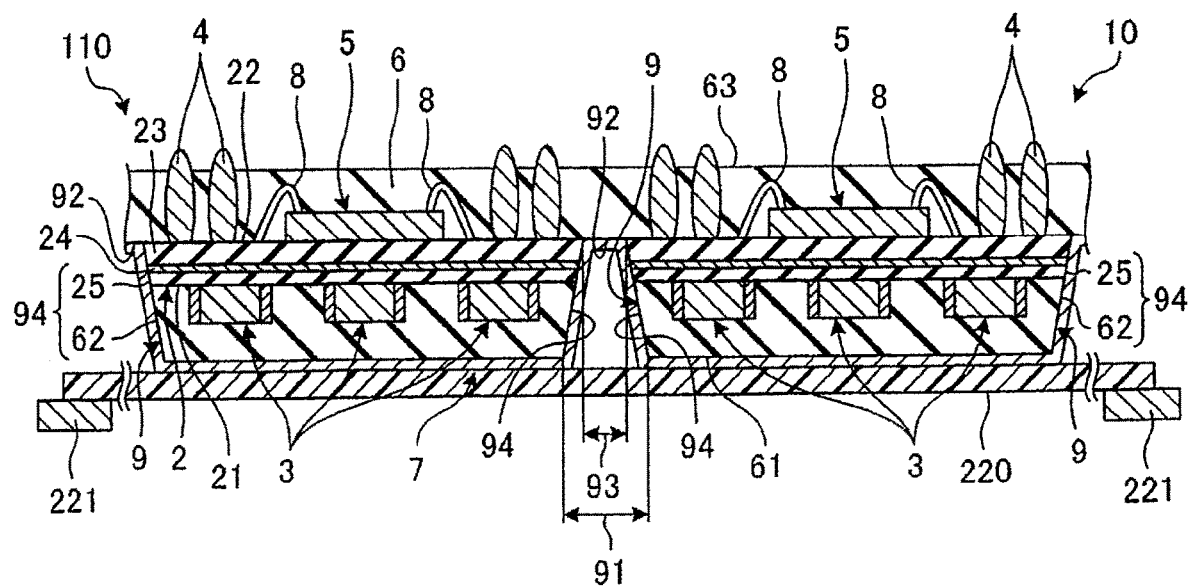
FIG. 12 is a cross-sectional view schematically illustrating a state in which a semiconductor package substrate is supported by a dicing tape in a groove forming step of a manufacturing method of a semiconductor package according to a second embodiment.
Figure 13:
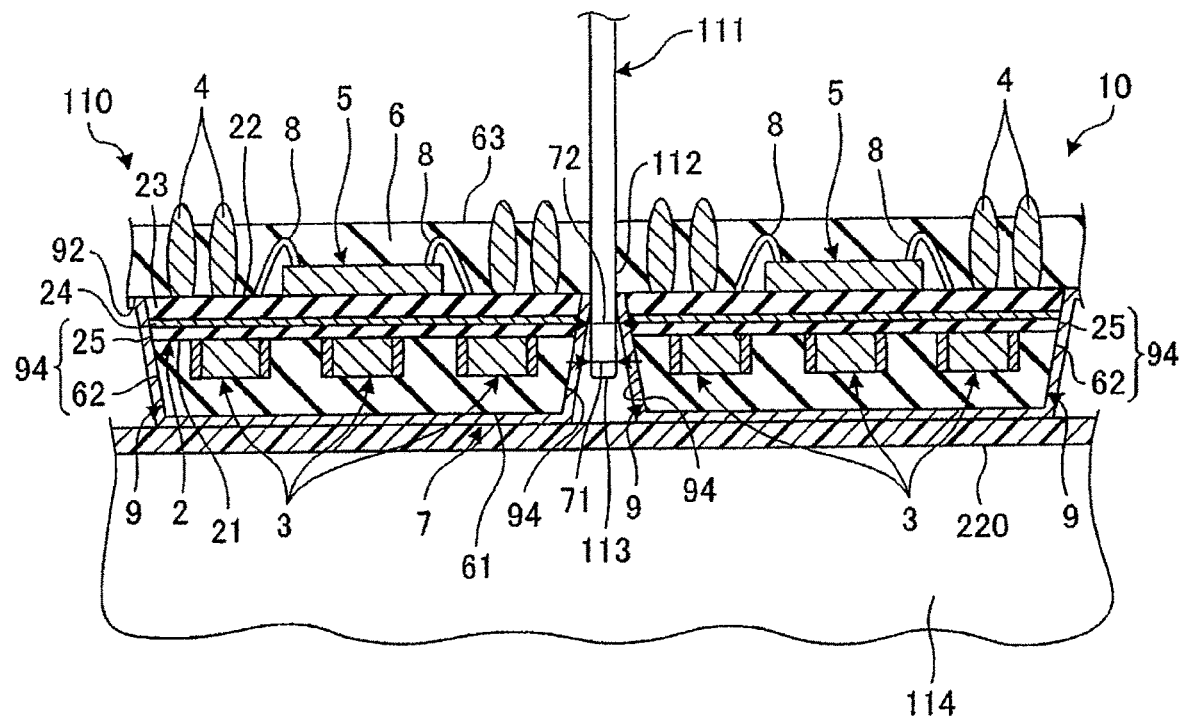
FIG. 13 is a cross-sectional view schematically illustrating a dividing step of the manufacturing method of the semiconductor package according to the second embodiment.
Figure 14:
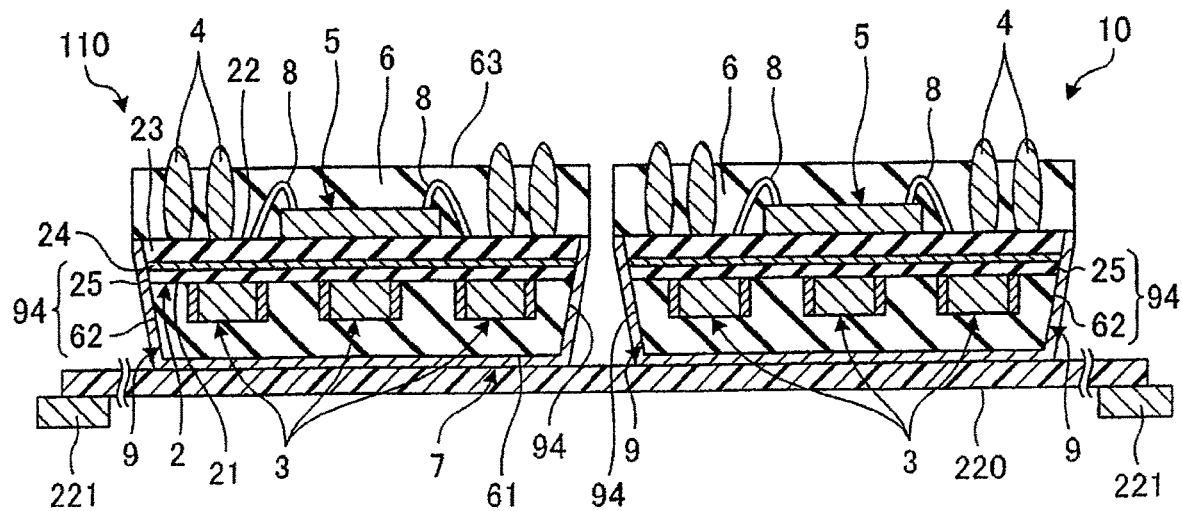
FIG. 14 is a cross-sectional view schematically illustrating the semiconductor package substrate after the dividing step of the manufacturing method of the semiconductor package according to the second embodiment is carried out.

A manufacturing method of a semiconductor package according to a second embodiment will be described below with reference to the drawings. FIG. 12 is a cross-sectional view schematically illustrating a state in which a semiconductor package substrate is supported by a dicing tape in a groove forming step of the manufacturing method of the semiconductor package according to the second embodiment. FIG. 13 is a cross-sectional view schematically illustrating a dividing step of the manufacturing method of the semiconductor package according to the second embodiment. FIG. 14 is a cross-sectional view schematically illustrating the semiconductor package substrate after the dividing step of the manufacturing method of the semiconductor package according to the second embodiment is carried out. In FIGS. 12 to 14, the same components as those in the first embodiment are denoted by the same reference numerals, and the repetitive description thereof is omitted.

The manufacturing method of a semiconductor package according to the second embodiment is the same as in the first embodiment except that the dividing step ST3 thereof is different from that in the first embodiment and the semiconductor package substrate 10 has the alignment marks 26 formed on both the upper surface 21 and the lower surface 22 of the outer edge portion of the wiring substrate 2 which is exposed without being sealed with the sealing material 6. In the dividing step ST3 of the manufacturing method of a semiconductor package according to the second embodiment, as illustrated in FIG. 12, a dicing tape 220 larger than a planar shape of the semiconductor package substrate 10 is attached to the upper surface 61 of the sealing material 6, and an annular frame 221 is attached to an outer peripheral edge of the dicing tape 220, while the sputtering tape 210 is peeled off from the lower surface 63 of the sealing material 6 of the semiconductor package substrate 10.

In the dividing step ST3 of the second embodiment, as illustrated in FIG. 13, the cutting apparatus 110 sucks and holds the upper surface 61 side of the sealing material 6 of the semiconductor package substrate 10 through the dicing tape 220 on the holding surface 115 of the chuck table 114 thereof. In the dividing step ST3, the infrared camera (not illustrated) of the cutting apparatus 110 images the lower surface 63 of the sealing material 6 of the semiconductor package substrate 10, and then, alignment for positioning between the semiconductor package substrate 10 and the second cutting blade 111 is performed. Note that, in the second embodiment, alignment is performed in accordance with the alignment marks 26 as a reference, since the alignment marks 26 are formed on the outer edge of the lower surface 22 of the wiring substrate 2 and exposed without being sealed with the sealing material 6.

In the dividing step ST3, the cutting apparatus 110 causes the second cutting blade 111 to cut the semiconductor package substrate 10 from the lower surface 63 side until the second cutting blade 111 reaches the bottom surface 92 of the processing groove 9, while relatively moving the semiconductor package substrate 10 and the second cutting blade 111 along the division lines 11, thereby dividing the semiconductor package substrate 10 into individual semiconductor packages 1. The manufacturing method of a semiconductor package according to the second embodiment ends after the second cutting blade 111 cuts the bottom surfaces 92 of the processing grooves 9 corresponding to all of the division lines 11 of the semiconductor package substrate 10 as illustrated in FIG. 14. Note that the individual semiconductor packages 1 thus divided are picked up from the dicing tape 220 by a well-known pick-up apparatus or the like.

In the manufacturing method of a semiconductor package according to the second embodiment, since the semiconductor package substrate 10 is cut by the first cutting blade 101 to a depth not fully being cut in the groove forming step ST1, it is possible to reduce a time required for forming the shielding layer 7 in the shielding layer forming step ST2 and reduce the number of process steps required for transferring the semiconductor package substrate 10 among the dicing tapes 200 and 220, and the sputtering tape 210. As a result, the manufacturing method of a semiconductor package according to the second embodiment can prevent an increase in number of required process steps, similarly to the first embodiment.

In addition, in the manufacturing method of a semiconductor package according to the second embodiment, since the semiconductor package substrate 10 is cut by the first cutting blade 101 to a depth not fully being cut in the groove forming step ST1 and the shielding layer 7 is then formed in the shielding layer forming step ST2, it is possible to prevent the shielding layer 7 from coming in contact with the sputtering tape 210. As a result, the manufacturing method of a semiconductor package according to the second embodiment can prevent peeling-off of the shielding layer 7 and occurrence of a burr of the shielding layer 7, similarly to the first embodiment.

Note that the present invention is not limited to the embodiments described above, or the like. More specifically, various modifications can be made without departing from the gist of the present invention. For example, in a case in which the alignment marks 26 are not formed on the upper surface 21 or the lower surface 22 of the outer edge portion of the wiring substrate 2, and a case in which the alignment marks 26 cannot be detected since the upper surface 21 and the lower surface 22 including the outer edge portion of the wiring substrate 2 are entirely sealed with the sealing material 6, the cutting apparatus 100 may image the semiconductor package substrate 10 by the infrared camera thereof in the groove forming step ST1 to detect the division lines 11, thereby performing alignment. Similarly, in either case described above, the cutting apparatus 110 may image the semiconductor package substrate 10 by the imaging unit thereof in the dividing step ST3 to detect the bottom surface 92 of the processing groove 9, thereby performing alignment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method of a semiconductor package by dividing a semiconductor package substrate along a plurality of intersecting division lines, into individual semiconductor packages, the semiconductor package substrate in which a plurality of semiconductor chips are mounted on an upper surface of a wiring substrate demarcated by the plurality of intersecting division lines, a plurality of solder balls are mounted on a lower surface of the wiring substrate, and both the upper surface including the plurality of semiconductor chips and the lower surface are sealed by a sealing material formed on the upper surface and the lower surface, thereby manufacturing individual semiconductor packages, the method comprising:

a groove forming step of cutting the semiconductor package substrate from the upper surface side through the sealing material formed on the plurality of semiconductor chips along the plurality of intersecting division lines in a cut-in-depth range of at least such a depth as to cause a ground line included in the wiring substrate to be exposed in a processing groove to such a depth that the semiconductor package substrate is not fully cut with first cutting means, thereby forming the processing groove having a first width at least on an upper surface of the sealing material;

a shielding layer forming step of, after the groove forming step is carried out, forming a shielding layer on a side surface of the processing groove, a bottom surface of the processing groove, and the upper surface of the sealing material formed on the plurality of semiconductor chips with a conductive material from an upper side of the sealing material; and a dividing step of, after the shielding layer forming step is carried out, cutting the semiconductor package substrate at such a width that the shielding layer formed over the side surface of the processing groove is not removed with second cutting means, thereby dividing the semiconductor package substrate into individual semiconductor packages.

2. The manufacturing method of a semiconductor package according to claim 1, wherein
in the groove forming step, an upper surface of the processing groove has a first width larger than a second width of the bottom surface of the processing groove, and the side surface of the processing groove is inclined.

3. The manufacturing method of a semiconductor package according to claim 2, wherein
the width that the semiconductor package substrate is cut in the dividing step is equal to or narrower than the bottom surface of the processing groove.

4. The manufacturing method of a semiconductor package according to claim 1, wherein
the ground line is cut with the first cutting means during the groove forming step.

5. The manufacturing method of a semiconductor package according to claim 1, wherein
the shielding layer is electrically connected to the ground line exposed in the processing groove.

6. A manufacturing method of a semiconductor package by dividing a semiconductor package substrate along a plurality of intersecting division lines, into individual semiconductor packages, the semiconductor package substrate in which a plurality of semiconductor chips are mounted on an upper surface of a wiring substrate demarcated by the plurality of intersecting division lines, a plurality of solder balls are mounted on a lower surface of the wiring substrate, and each of the upper surface including the plurality of semiconductor chips and the lower surface is sealed by a sealing material formed on each of the upper surface and the lower surface, thereby manufacturing individual semiconductor packages, the method comprising:

a groove forming step of cutting the semiconductor package substrate from the upper surface side through the sealing material formed on the plurality of semiconductor chips along the plurality of intersecting division lines in a cut-in-depth range of at least such a depth as to cause a ground line included in the wiring substrate to be exposed in a processing groove to such a depth that the semiconductor package substrate is not fully cut with first cutting means, thereby forming the processing groove having a first width at least on an upper surface of the sealing material;

a shielding layer forming step of, after the groove forming step is carried out, forming a shielding layer on a side surface of the processing groove, a bottom surface of the processing groove, and the upper surface of the sealing material formed on the plurality of semiconductor chips with a conductive material from an upper side of the sealing material; and a dividing step of, after the shielding layer forming step is carried out, cutting the semiconductor package substrate at such a width that the shielding layer formed over the side surface of the processing groove is not removed with second cutting means, thereby dividing the semiconductor package substrate into individual semiconductor packages.

* * * * *